United States Patent
Hornback et al.

[11] Patent Number: 6,071,562
[45] Date of Patent: Jun. 6, 2000

[54] PROCESS FOR DEPOSITING TITANIUM NITRIDE FILMS

[75] Inventors: Verne Hornback; Derryl Allman, both of Colorado Springs, Colo.

[73] Assignee: LSI Logic Corporation, Milpitas, Calif.

[21] Appl. No.: 09/074,298

[22] Filed: May 7, 1998

[51] Int. Cl.[7] .................................................. C23C 16/34
[52] U.S. Cl. .............................. 427/255.394; 427/255.23; 427/255.28; 427/126.1; 427/314
[58] Field of Search ..................... 427/255.28, 255.23, 427/314, 255.394, 126.1; 438/681, 685

[56] References Cited

U.S. PATENT DOCUMENTS

| | | | |
|---|---|---|---|
| 5,192,589 | 3/1993 | Sandhu | 427/255.1 |
| 5,278,100 | 1/1994 | Doan et al. | 437/200 |
| 5,480,684 | 1/1996 | Sandhu | 427/531 |
| 5,571,572 | 11/1996 | Sandhue | 427/585 |
| 5,607,722 | 3/1997 | Vaartstra et al. | 427/248.1 |
| 5,612,558 | 3/1997 | Harshfield | 257/298 |
| 5,659,057 | 8/1997 | Vaartstra | 556/51 |
| 5,672,385 | 9/1997 | Jimba et al. | 427/248.1 |
| 5,691,009 | 11/1997 | Sandhu | 427/534 |
| 5,693,377 | 12/1997 | Westmorlenad et al. | 427/582 |
| 5,741,547 | 4/1998 | Akram et al. | 427/255.2 |
| 5,763,007 | 6/1998 | Weiller | 427/248.1 |
| 5,789,028 | 8/1998 | Zhao et al. | 427/255.2 |
| 5,895,267 | 4/1999 | Zhao et al. | 438/627 |

*Primary Examiner*—Roy V. King

[57] ABSTRACT

The present invention provides an efficient process for depositing a titanium nitride film on a substrate. The process comprises the steps of heating the substrate and subsequently exposing the heated substrate to a first gas containing tetrakis(dimethylamido)titanium and to a second gas containing tetrakis(diethylamido)titanium.

22 Claims, No Drawings

PROCESS FOR DEPOSITING TITANIUM NITRIDE FILMS

BACKGROUND OF THE INVENTION

Chemical vapor deposition (CVD) is defined as the formation of a non-volatile solid film on a substrate by the reaction of vapor phase reactants. The gaseous reactants are introduced into a reactor vessel, and decompose and react at a heated surface of the substrate to form the desired film. Chemical vapor deposition is often the preferred process for depositing thin films on substrates such as semiconductor wafers, principally because of its ability to provide highly conformal layers even within deep contacts and other openings.

CVD methods have been utilized in the past to deposit titanium nitride (TiN) films. In microelectric devices, TiN films can be used as low resistance contacts and as diffusion barriers in interconnect metallization schemes.

The method of depositing TiN by CVD utilizing the reaction of $TiCl_4$ and $N_2$ or $NH_3$ has been known for many years. However, this method has several severe drawbacks. Foremost among these is the high (600–700° C.) temperature required for deposition of pure films. The incorporation of unbonded chlorine is inversely related to the deposition temperature. These two traits make $TiCl_4$ based CVD TiN wholly inappropriate for use in aluminum based IC processing at the via levels. However, the use of $TiCl_4$ for the specialized application of contact metallization has been recently proven. As a further reason for the inappropriateness of this method to IC processing, the reaction is prone to depositing salts/adducts on chamber walls which in turn lead to particulate generation and cleaning concerns.

Two metal-organic compounds have received a significant amount of study recently; tetrakis(dimethlyamido)titanium (TDMAT), and tetrakis(diethylamido)titanium (TDEAT). These compounds have the ability to deposit TiN by CVD when co-reacted with a nitrogen source or from pure pyrolysis. But under certain conditions, including pyrolysis and very low co-reactant concentrations, the film will contain significant amounts of carbon and will be porous leading to moisture/oxygen absorption upon exposure to the atmosphere. Due to the differences in reaction kinetics, the resultant films deposited from these two metal-organic compounds are distinctly and significantly different. For similar processing conditions, the TDEAT reaction always produces a film that is much lower (orders of magnitude) in bulk resistivity, significantly lower in carbon content, and much more stable in terms of atmospheric exposure (changes in resistivity). Furthermore, films deposited from TDEAT have significantly better step coverage when processed within the same process regime.

While TDEAT does have the above advantages, it has certain disadvantages that result in processing difficulties. First, at a given temperature, the vapor pressure of TDEAT is about two orders of magnitude lower than TDMAT; this can lead to difficulties in delivering a usable amount of TDEAT to the reactor vessel. Second, the deposition rate of a CVD TiN film derived from TDEAT is about one-fourth the rate of TDMAT; this can lead to an unacceptably low throughput.

Therefore, a need exists for an improved process for manufacturing TiN films that reduces these difficulties.

FIELD OF THE INVENTION

The present invention provides an efficient process for depositing a film comprising titanium nitride from tetrakis(dimethylamido)titanium and tetrakis(diethylamido) titanium.

SUMMARY OF THE INVENTION

The present invention provides an improved process for applying a film comprising titanium nitride on the surface of a substrate.

It has been surprisingly found that the throughput can be significantly increased and the quality of the TiN film (i.e., resistivity, carbon content and stability) maintained if the film is deposited on the substrate by either successive use of TDMAT and TDEAT or a deposition using a combination of both sources. Both methods allow for a tailoring of the carbon content and bulk resistivity of the final film.

For a process where TDMAT and TDEAT are successively used, the process comprises the steps of:

a) exposing the substrate to a first gas comprising tetrakis(dimethylamido)titanium;

b) maintaining a first temperature of the substrate and a pressure of the first gas that is effective to deposit from the first gas a first layer onto at least a portion of the surface of the substrate;

c) exposing the substrate having the first layer to a second gas comprising tetrakis(diethylamido)titanium;

d) maintaining a second temperature of the substrate and a pressure of the second gas that is effective to deposit from the second gas a second layer onto at least a portion of the surface of the substrate to form a film comprising titanium nitride on the substrate.

The process of the present invention may combine the flow of both TDEAT and TDMAT into the CVD chamber at the same time. The ratio of gases, TDEAT to TDMAT can be in a range of 1:1 to 500:1. This ratio can be controlled by controlling the delivery temperature or by controlling the liquid injection rates of the chemicals. For a film that would have ½ the carbon content, a gas flow ratio of 2:1 (TDEAT:TDMAT) would be used.

The first gas may further comprise a diluent and/or reactant gas. Additionally, the second gas may further comprise a diluent and/or reactant gas. The diluent gas may be argon or helium. The reactant gas contains nitrogen, and may be $N_2$ or $NH_3$. The process is typically performed in a chemical vapor deposition reactor. The temperature of the substrate can be between about 300 to about 450° C. when exposed to the first gas and between about 300 to about 400° C. when exposed to the second gas, with a typical temperature of 400° C. for the first gas containing TDMAT and 350° C. for the second gas containing TDEAT. The range in pressure for this process is between about 0.5 to about 5 torr and preferably about 1 to about 2 torr. The typical operating pressure is 1.5 torr for both TDEAT and TDMAT. The pressures of the first and second gases, and the amounts of the reactant and diluent gases are controlled to thereby form the film comprising titanium nitride having a predetermined level of titanium, nitrogen and carbon content as well as a predetermined level of bulk resistivity.

Metal-organic compounds containing titanium or titanium and nitrogen other than TDEAT and TDMAT may be used in the process of the present invention if such compounds are gaseous in the temperature range of about 0 to about 150° C. and decompose at a temperature of less than 550° C. Preferably, the compounds exhibit vapor pressure ranges substantially similar to TDEAT and TDMAT.

DETAILED DESCRIPTION OF THE INVENTION

Any CVD apparatus design may be used when depositing TiN films from TDMAT and TDEAT including hot wall reactors, cold wall reactors, radiation beam assisted reactors, plasma assisted reactors, and the like. Preferably, the CVD process utilizes a cold wall-hot substrate reactor. In this reactor the substrate on which deposition is to occur is heated to a temperature sufficient to cause the decomposition of TDMAT and TDEAT. This decomposition may occur in the presence of an inert carrier gas and/or a reactant gas. The preferred carrier gases are argon and helium. The reactant gases may be ammonia, nitrogen, hydrazine, hydrogen, nitrogen trifluoride, and the like. The more preferred reactant gas is nitrogen or ammonia.

Operating pressures of 1 mtorr to 100 mtorr have been used in the absence of carrier gas. When carrier gases are used, pressures may range from about 0.01 torr to about 760 torr (atmospheric pressure) and are more preferably in the range of 0.1 to 300 torr.

Any type of substrate can be used in CVD, including metals, graphite, semiconductors, insulators, ceramics and the like as long as the substrate is not substantially deteriorated under the deposition conditions. Furthermore, suitable substrates may have one or more deposit layers already present. Such substrates include, but are not limited to, silicon, silicon dioxide (silica), titanium, tin oxide, gallium arsenide (GaAs), glass, alumina, aluminum, zirconia, as well as polyimide, polymethyl-meth-acrylate, polystyrene and other synthetic polymers. More specifically, substrates useful for electronic device applications include Si<100>, Si<311>, Si<111>, Si<110>, GaAs<110>, GaAs<111> and GaAs<311> wafers. Prior to initiating CVD, the substrates, such as Si<100> wafers, can be pre-cleaned by the standard method of wet chemical etches in baths of dilute hydrofluoric acid. RF sputtering using argon may also be used.

CVD can be used to deposit films on planar substrate surfaces and into recesses, trenches, and vias, and over stepped surfaces, such as those which are topologically microstructured. The substrate does not have to be a silicon wafer for IC processing.

DESCRIPTION OF THE PREFERRED EMBODIMENT

The invention will be further described by reference to the following examples.

EXAMPLE 1

Five silicon wafers, 200 mm in diameter are placed in a barrel cold wall CVD reactor. The wafers sit on a Novellus Concept 2 platform. The reactor is evacuated to a base pressure of less than 50 torr, and then the wafers are heated to 300–475° C. A mixture of helium gas, ammonia and TDMAT is then introduced for a period of 2–15 seconds with a flow rate of 100–500 sccm for the TDMAT and helium gas, and a flow rate of ammonia to reach a ratio of 2–50:1 of ammonia to TDMAT. A mixture of helium gas, ammonia and TDEAT is then introduced for a period of 2–15 seconds with a flow rate of 100–500 sccm for the TDEAT and helium gas, and a flow rate of ammonia to reach a ratio of 2–50:1 of ammonia to TDEAT. The flow rates of the TDEAT and TDMAT are regulated by a liquid flow controller and introduced into a concentric injector/evaporator assembly. A helium gas stream then carries the vaporized liquid from this assembly into the CVD reactor via a showerhead. Helium gas flow is set so that the process pressure is in the range of 0.5–5 torr.

Using the above process, a throughput rate of about 100 wafers per hour (WPH) is achieved. This is in contrast to the throughput rate of 50 WPH if TDEAT is used alone.

The physical characteristics of the final TiN film made by the above process are expected to be the following:

resistivity=1000 $\mu\Omega$-cm stability=<5% over 24 hours thickness=50 to 200 Å

C content=5 to 20%

EXAMPLE 2

Five silicon wafers, 200 mm in diameter, are placed in a barrel cold wall CVD reactor. The wafers sit in a Novellus Concept 2 platform. The reactor is evacuated to a base pressure of less than 50 torr, and then the wafers are heated to 300–475° C. A gas mixture of helium gas, ammonia, TDEAT and TDMAT is flowed into the reactor at a rate of 500 sccm for a period of 5–15 seconds, depending on the desired thickness of the final TiN film. The gas mixture has a ratio of 2:1 TDEAT to TDMAT, and the ammonia is in a concentration of 2–50:1 ammonia to TDEAT and TDMAT. Helium gas flow is set so that the process pressure is in the range of 0.5–5 torr. Typically, a flow period of 10 seconds will result in a film that is 100 Å thick. The flow rates of both the TDEAT and TDMAT are regulated by a liquid flow controller and are introduced into a concentric injector/evaporator assembly. A carrier gas stream then carries the vaporized liquids from this assembly into the CVD reactor via a showerhead.

Using this process, the throughput rate and physical characteristics of the final TiN film are expected to be similar to those of Example 1.

It should be readily apparent to those skilled in the art that the methods and advantages of the present invention may be used in depositing titanium nitride onto a substrate in a variety of ways. The description and examples are set forth in the specification for the purposes of illustration only and are by no means intended to be limiting of the invention. The scope and nature of the invention are set forth in the claims which follow.

What is claimed is:

1. A process for depositing a film comprising titanium nitride on a substrate, comprising the steps of:

a) exposing the substrate to a first gas comprising tetrakis (dimethylamido)titanium for a first period in the range of 2 to 15 seconds;

b) maintaining a first temperature of the substrate and a pressure of the first gas that is effective to deposit from the first gas a first layer onto at least a portion of the surface of the substrate; and then c) exposing the substrate having the first layer to a second gas comprising tetrakis(diethylamido)titanium for a second period in the range of 2 to 15 seconds;

d) maintaining a second temperature of the substrate and a pressure of the second gas that is effective to deposit from the second gas a second layer onto at least a portion of the surface of the substrate to form said film comprising titanium nitride on the substrate.

2. The process of claim 1 wherein the first gas further comprises a diluent or a nitrogen-containing reactant gas.

3. The process of claim 2 wherein the diluent gas is selected from the group consisting of argon and helium.

4. The process of claim 2 wherein the nitrogen-containing reactant gas is nitrogen or ammonia.

5. The process of claim 1 wherein the second gas further comprises a diluent or nitrogen-containing reactant gas.

6. The process of claim 5 wherein the diluent gas is selected from the group consisting of argon and helium.

7. The process of claim 5 wherein the reactant gas is selected from the group consisting of nitrogen and ammonia.

8. The process of claim 1 wherein the substrate is aluminum, silicon, silicon dioxide or titanium.

9. The process of claim 1 wherein the substrate is a semiconductor wafer.

10. The process of claim 1 wherein the steps occur in a chemical vapor deposition reactor.

11. The process of claim 1 wherein the first temperature is between about 300 to about 450° C.

12. The process of claim 1 wherein the second temperature is between about 300 to about 400° C.

13. The process of claim 1 wherein the pressure of the first gas is between about 0.5 to about 5 torr.

14. The process of claim 1 wherein the pressure of the second gas is between about 0.5 to about 5 torr.

15. The process of claim 2 wherein the pressures of the first and second gases, and the amounts of the reactant and diluent gases are controlled to thereby form the film comprising titanium nitride having a predetermined titanium, nitrogen and carbon content.

16. The process of claim 2 wherein the pressures of the first and second gases, and the amounts of the reactant and diluent gases are controlled to thereby form the film comprising titanium nitride having a predetermined bulk resistivity.

17. A process for depositing a film comprising titanium nitride on a substrate, comprising the steps of:

a) exposing the substrate to a gas comprising tetrakis (diethylamido) titanium and tetrakis (dimethylamido) titanium in a ration of 1:1 to 500:1;

b) maintaining a temperature of the substrate that is effective to deposit from the gas onto at least a portion of the surface of the substrate to form said film comprising titanium nitride on the substrate.

18. The process of claim 17 wherein the ratio is 2:1.

19. The process of claim 17 wherein the ratio is controlled by the delivery temperatures of tetrakis (diethylamido) titanium and tetrakis (dimethylamido) titanium.

20. The process of claim 17 wherein the ratio is controlled by the liquid injection rates of tetrakis (diethylamido) titanium and tetrakis (dimethylamido) titanium.

21. The process of claim 17 wherein the amounts of tetrakis (diethylamido) titanium and tetrakis (dimethylamido) titanium in the gas are controlled to thereby form the film comprising titanium nitride having a predetermined titanium, nitrogen and carbon content.

22. The process of claim 17 wherein the amounts of tetrakis (diethylamido) titanium and tetrakis (dimethylamido) titanium in the gas are controlled to thereby form the film comprising titanium nitride having a predetermined bulk resistivity.

* * * * *